United States Patent
Seligson

(10) Patent No.: US 6,940,501 B2
(45) Date of Patent: Sep. 6, 2005

(54) TILED DISPLAY

(75) Inventor: Daniel Seligson, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 527 days.

(21) Appl. No.: 09/819,831

(22) Filed: Mar. 28, 2001

(65) Prior Publication Data

US 2002/0142501 A1 Oct. 3, 2002

(51) Int. Cl.$^7$ .................................................. G09G 5/00
(52) U.S. Cl. ...................................... 345/205; 345/1.3
(58) Field of Search .................... 345/1.1, 1.3, 44–46, 345/55, 76, 87, 205, 206, 82, 83, 1.2, 903, 32, 88, 90, 103; 349/153, 73, 74, 37, 143

(56) References Cited

U.S. PATENT DOCUMENTS

| | | | | |
|---|---|---|---|---|
| 4,906,071 A | * | 3/1990 | Takahara et al. ............... 349/73 |
| 5,808,710 A | * | 9/1998 | Pierson ......................... 349/73 |
| 5,904,545 A | | 5/1999 | Smith et al. .................. 483/455 |
| 6,292,157 B1 | * | 9/2001 | Greene et al. ................ 345/1.3 |
| 6,370,019 B1 | * | 4/2002 | Matthies et al. ............. 361/681 |
| 6,456,354 B2 | * | 9/2002 | Greene et al. ............... 349/153 |
| 6,498,592 B1 | * | 12/2002 | Matthies ....................... 345/1.1 |
| 6,528,822 B2 | * | 3/2003 | Murade ......................... 257/72 |
| 2002/0001046 A1 | * | 1/2002 | Jacobsen et al. .............. 349/42 |
| 2004/0004609 A1 | * | 1/2004 | Holman ......................... 345/211 |

OTHER PUBLICATIONS

"Fluid Self Assembly", Alien Technology Corporation, White Paper, Oct. 1999.

D. Lieberman, "VCs Welcome Alien Flat-Panel Display Technology", EE Times, Aug. 13, 1999.

* cited by examiner

Primary Examiner—Regina Liang
(74) Attorney, Agent, or Firm—Trop, Pruner & Hu, P.C.

(57) ABSTRACT

A tiled display may be formed on a substrate with a plurality of display elements which may be light emitting or non-light emitting display elements. A driver circuit for the display elements may be integrated into the display proximate to the display elements. In one embodiment, a complementary metal oxide semiconductor integrated circuit may form the driver circuit and may be secured within a recess in the same substrate on which said display elements are formed. The integrated circuit and the display elements may then be interconnected using conventional techniques.

26 Claims, 7 Drawing Sheets

TILED DISPLAY

BACKGROUND

This invention relates generally to tiled displays.

Tiled displays may be made up of a plurality of display modules integrated by a plate such as a glass plate. Thus, the overall display image may be made up of subimages created by each of the display modules. By coordinating the display of subimages on each module, an overall coherent image may be generated.

Each of the individual modules may include a large number of pixels which are driven by drivers generally located remotely from those pixels. Because the tiled displays are generally made of material incompatible with logic devices, such as display drivers, the display drivers are formed in a surface separate from the actual display elements. This spacing of course adds to the complexity of the overall tiled display. The greater distance between the driver and the display may also adversely effect the speed of the display. Moreover, the need to interconnect the pixel elements with the drivers may increase the cost of the overall display.

Commonly, logic elements such as display drivers are formed of complementary metal oxide semiconductor (CMOS) integrated circuits. These devices can be fabricated at low cost through high volume manufacturing procedures. In addition, the resulting devices are of extremely small size. Thus, the use of the CMOS integrated circuit fabrication techniques is generally preferred for making all types of logic devices including display drivers.

However, because of the basic incompatibility between the CMOS substrates and the substrates that are utilized in most display devices, a separate back plane must be provided on the display for mounting CMOS integrated circuits. These integrated circuits may then be connected from the back plane to the individual pixels or display elements. As mentioned above, this may result in reduced speed, increased cost, and overall complexity.

Some tiled displays use emissive display elements such as organic light emitting diodes. These displays use a passive matrix to drive the individual pixels. This has the advantage of reducing the cost, in particular the capital cost of the manufacturing infrastructure. However, a passive matrix drive (which is a form of multiplexing) puts extra demands on the emissive materials. When multiplexed, such materials are less efficient and have more reliability problems than when operated continuously.

Thus, there is a need for a way to make tiled displays in which the display drivers can be integrated into a display substrate.

DETAILED DESCRIPTION

Figure 1:
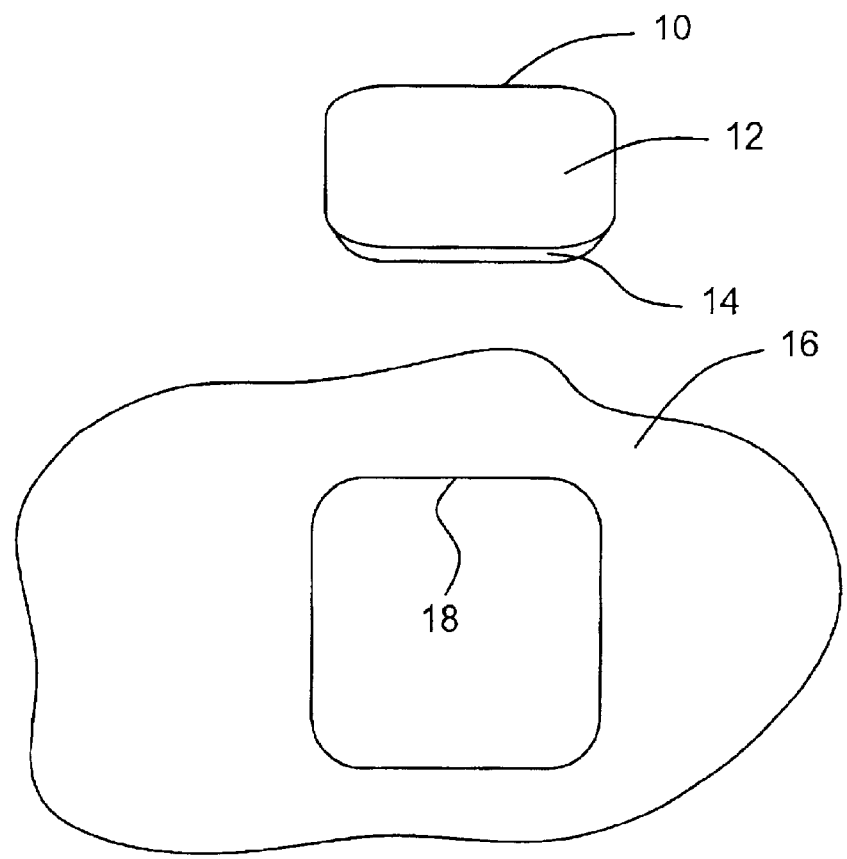
FIG. 1 is a partial, greatly enlarged perspective view of a trapezoidally-shaped block in position over a recessed region in a display substrate in accordance with one embodiment of the present invention.

Referring to FIG. 1, a trapezoidally-shaped complementary metal oxide semiconductor (CMOS) block 10, sometimes called a nanoblock, may include an upper surface 12 and angled or sloped side surfaces 14. The block 10 includes the CMOS driver circuits for driving a display element. The display element may be a liquid crystal display (LCD) element, an organic light emitting diode (OLED) or any of a variety of light emitting or non-light emitting display elements.

The block 10 is caused to enter a recessed region 18 in a substrate 16 that forms a tiled display. In some embodiments of the present invention, the substrate 16 may be a glass substrate conventionally utilized as the front plane in a tiled display. The tiled display substrate 16 may receive a very large number of blocks 10 to drive a very large number of display elements, each defining one or more pixels of an overall display.

Figure 2:
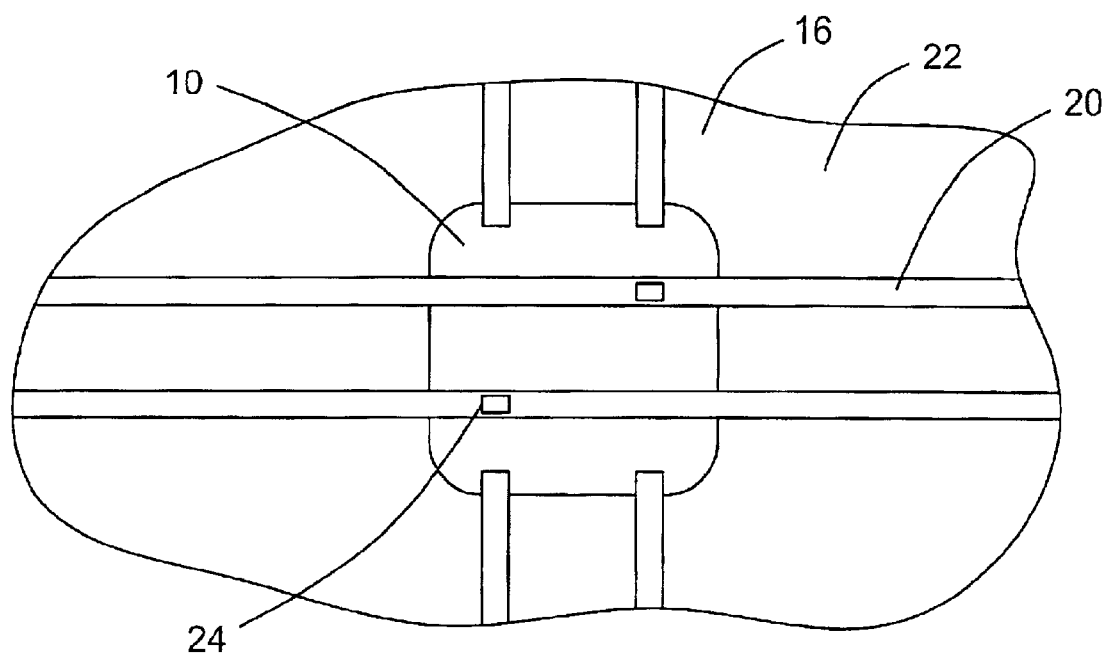
FIG. 2 is a partial plan view of the embodiment shown in FIG. 1 after the block has been inserted into the substrate and the substrate and block have been planarized and metallized in accordance with one embodiment of the present invention.

After each block 10 has been appropriately positioned in a recessed region 18 in the substrate 16, appropriate thin film metallizations 20, shown in FIG. 2, may be patterned over the substrate 16 and the block 10 to make electrical connections 24 to the various circuit components defined within the integrated circuits of the block 10. In one embodiment, the metallization 20 may be formed of a transparent conductor such as indium tin oxide. In addition, a passivation layer 22 may be provided over the block 10 and substrate 16. The metallization 20 and passivation layer 22 may effectively bind the block 10 to the substrate 16. However, as will be described in more detail hereinafter, other techniques may be utilized to further bind the block 10 and substrate 16.

Figure 3:
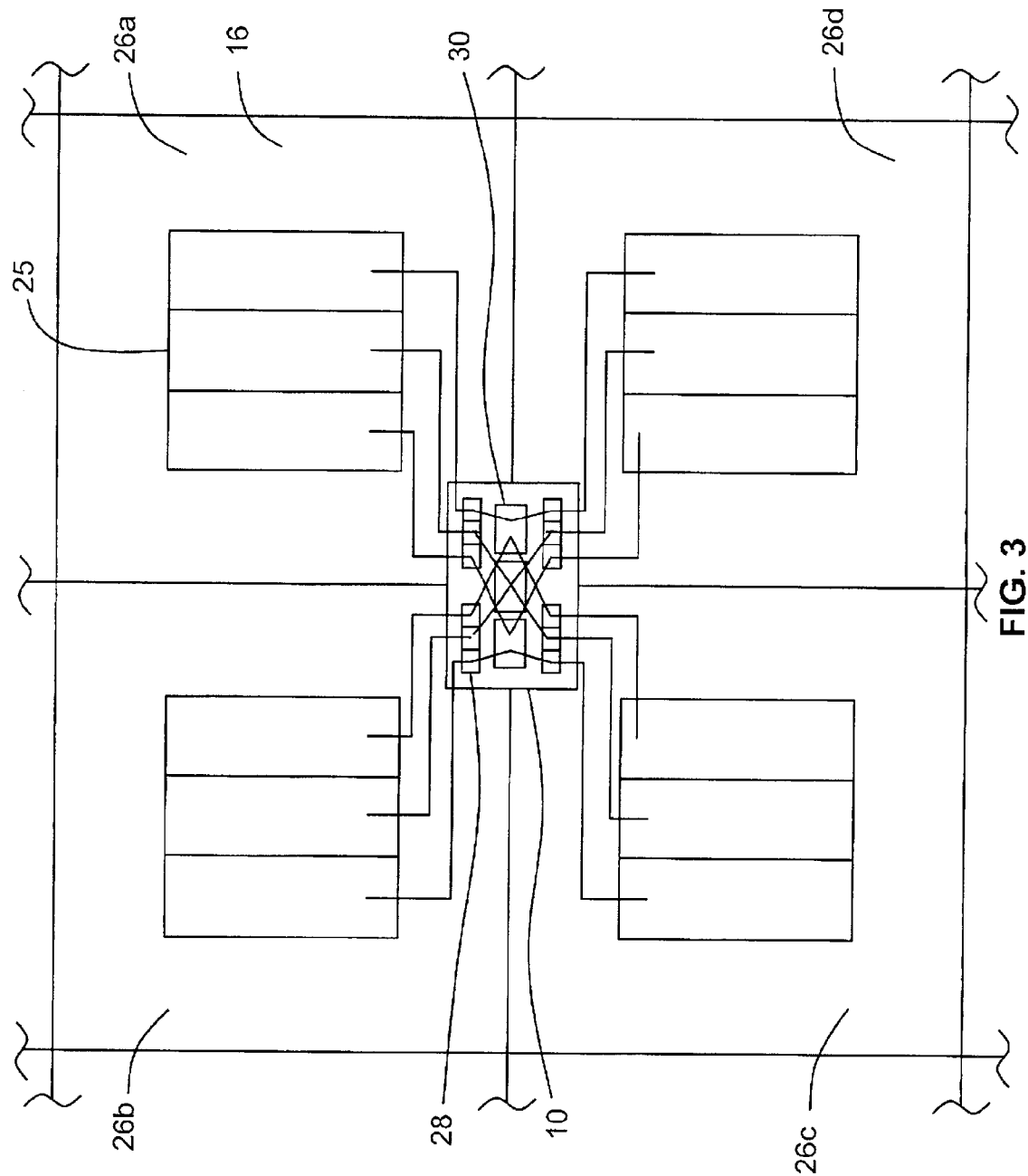
FIG. 3 is a top plan view of a portion of a tiled display in accordance with one embodiment of the present invention.

Referring to FIG. 3, a portion of the substrate 16 includes a plurality of pixel display elements 26. Each display element 26 may in turn create a set of colors associated with a known color space such as a red, green, blue (RGB) or YUV color spaces. Thus, each pixel color element 25 may selectively produce red, green or blue (or other colors). The individual pixel color element 25 corresponding to each color are driven by the circuitry included on the block 10. That is, each pixel color element 25 may be coupled to a driver 28 associated with the block 10 in one embodiment. In this way, each associated color may be independently driven.

In one embodiment of the present invention, the block 10 includes circuitry for driving a predetermined number, such as four, of display elements 26. As shown in FIG. 3, the driven circuits included in the block 10 then may be positioned proximately to the very display elements 26 which the driving circuits are intended to drive. This advantageous arrangement may result in reduced cost and improved operating speed.

The drivers 28 are coupled to bond pads 30. The bond pads 30 then couple by vias (not shown) to other control circuits, such as video choppers or compensation logic as two examples, on a back plane (not shown in FIG. 3).

Figure 5:
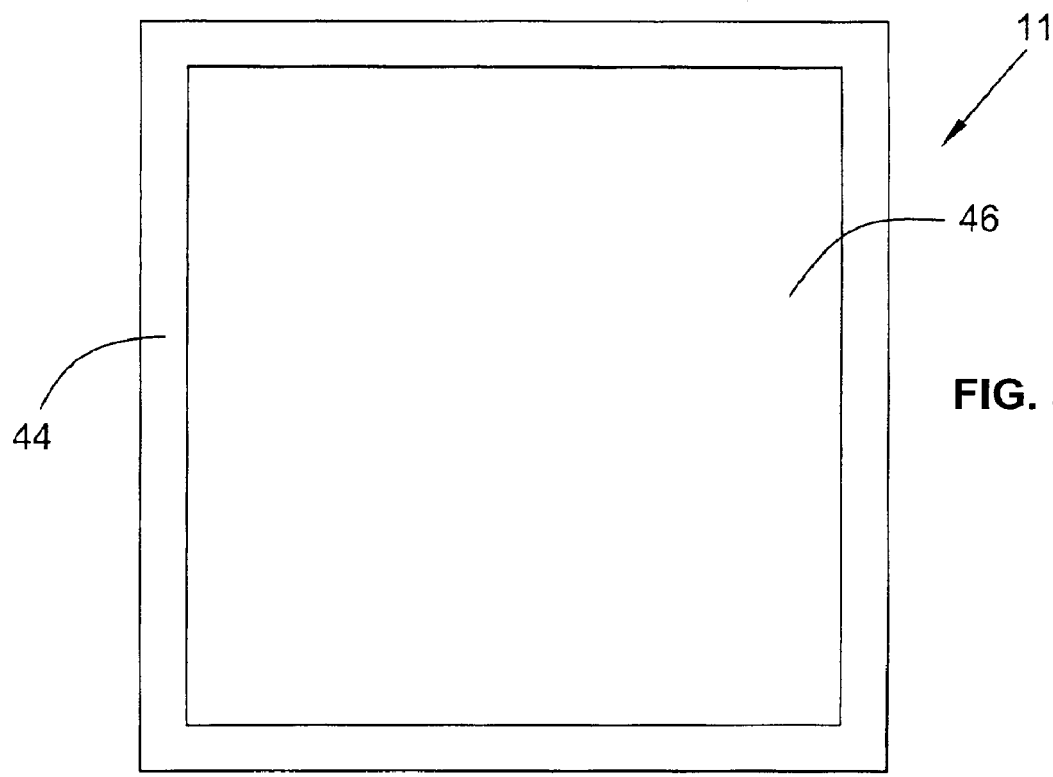
FIG. 5 is a top plan view of a tiled display in accordance with one embodiment of the present invention.
Figure 6:
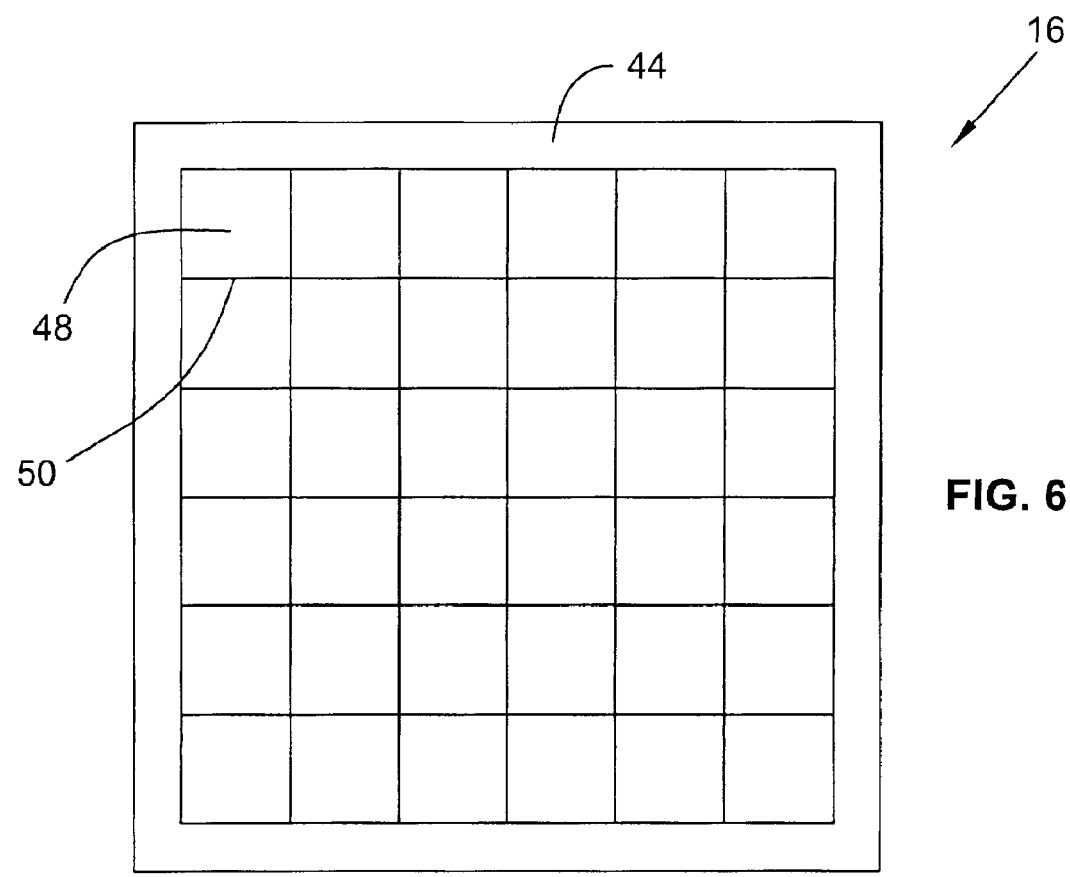
FIG. 6 is a back plan view of one embodiment of the present invention.

Turning next to FIG. 5, the overall tiled display 11 may include a frame 14 and a optical integrator 46 which may be formed of a glass plate as one example. The front plane substrate 16, shown in FIG. 6, may include a plurality of display modules 48 separated by joints 50. The display modules 48 collectively form subimages of the overall image visible from the front plane or substrate 16.

Figure 4:
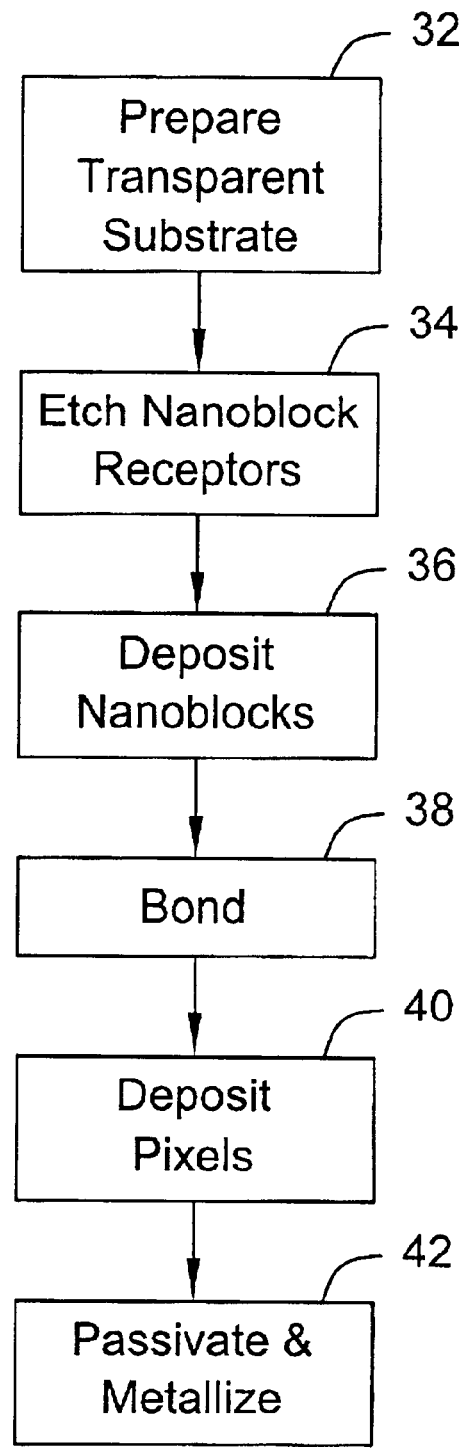
FIG. 4 is a flow chart for fabricating one embodiment of the present invention.

Referring to FIG. 4, an overview of the process of fabricating the blocks 10 and depositing them into the substrate 16 is depicted. Initially, the substrate 16 is prepared as indicated in block 32. The nanoblock receiving regions 18 are etched into the substrate 16 as indicated in block 34. The blocks 10 are then deposited as indicated in block 36. The blocks 10 then may be bonded to the substrate 16 as indicated in block 38. Thereafter, the pixels 25 may be defined as indicated in block 40 and the overall structure may be passivated and metallized as indicated in block 42.

Figure 7:
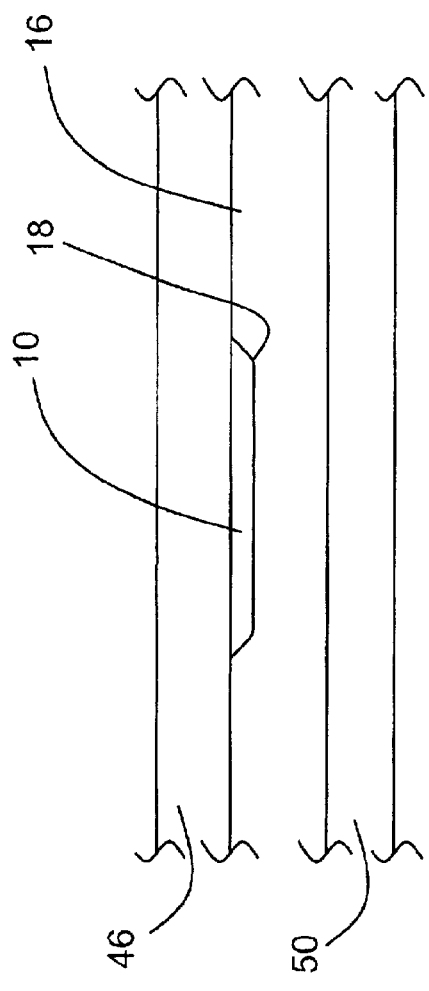
FIG. 7 is a greatly enlarged cross-sectional view through a portion of the tiled display shown in FIGS. 5 and 6.

Thus, referring to FIG. 7, the block 10 sits within the recessed region 18 of the front plane or substrate 16. The back plane 47 may include integrated control circuits that couple by vias (not shown) to the blocks 10. An optical integrator 46 may integrate a plurality of modules 48. The images generated by the pixel color elements 25 may be viewed from the substrate 16 in accordance with one embodiment of the present invention.

Figure 8:
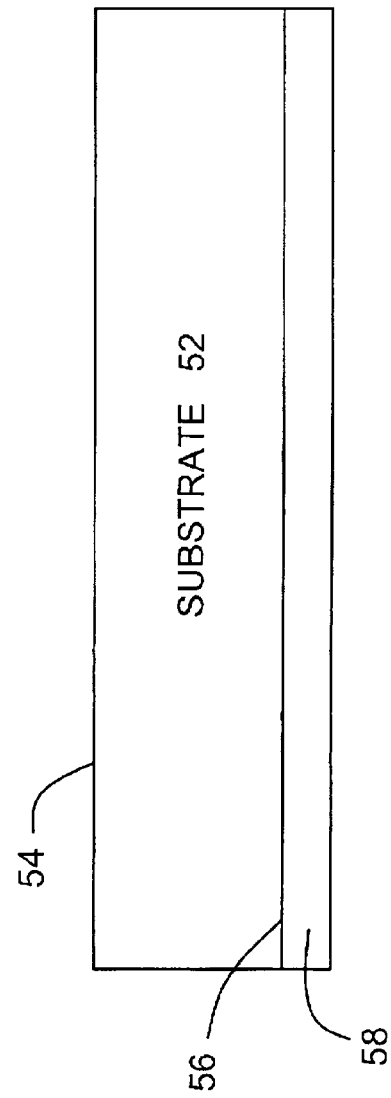
FIG. 8 is an enlarged view of a substrate utilized to form the trapezoidally-shaped blocks in accordance with one embodiment of the present invention.

The block 10 may be formed in a substrate 52, such as a silicon wafer, that has a bottom surface 56 and an upper surface 54, as shown in FIG. 8. Bottom surface 56 is the polished side of silicon wafer 52, and upper surface 54 is the unpolished, rough side. A sacrificial layer 58 overlying upper surface 56, may be formed by chemical vapor deposition, sputtering, molecular beam epitaxy, or the like.

Sacrificial layer 58 is a layer made of silicon nitride ($SiN_x$), silicon dioxide $SiO_2$, metals, or organics, with a thickness of about 100 Å to about 100 $\mu$m, such as a $SiN_x$ layer of about 0.4 $\mu$m thickness. Masking and etching steps can be used to form the trapezoidally-shaped blocks 10. In this embodiment, a trapezoidally-shaped block 10 includes a base with four sides protruding therefrom to a larger top surface. Each side creates an angle between about 20° and about 90° from the top surface to a side, and may be about 55° in one embodiment. The block may have a length between about 1 $\mu$m and about 1 cm, and a width between about 1 $\mu$m and about 1 cm, and may have a length of about 1.0 mm and a width of about 1.2 mm in one embodiment. The larger face is on, and in contact with, the sacrificial layer 58. A subsequent step of preferential etching removes sacrificial layer 58 to free each trapezoidally-shaped block 10 formed overlying sacrificial layer 58. The blocks 10 are then transferred into a fluid to form a slurry.

Figure 9:
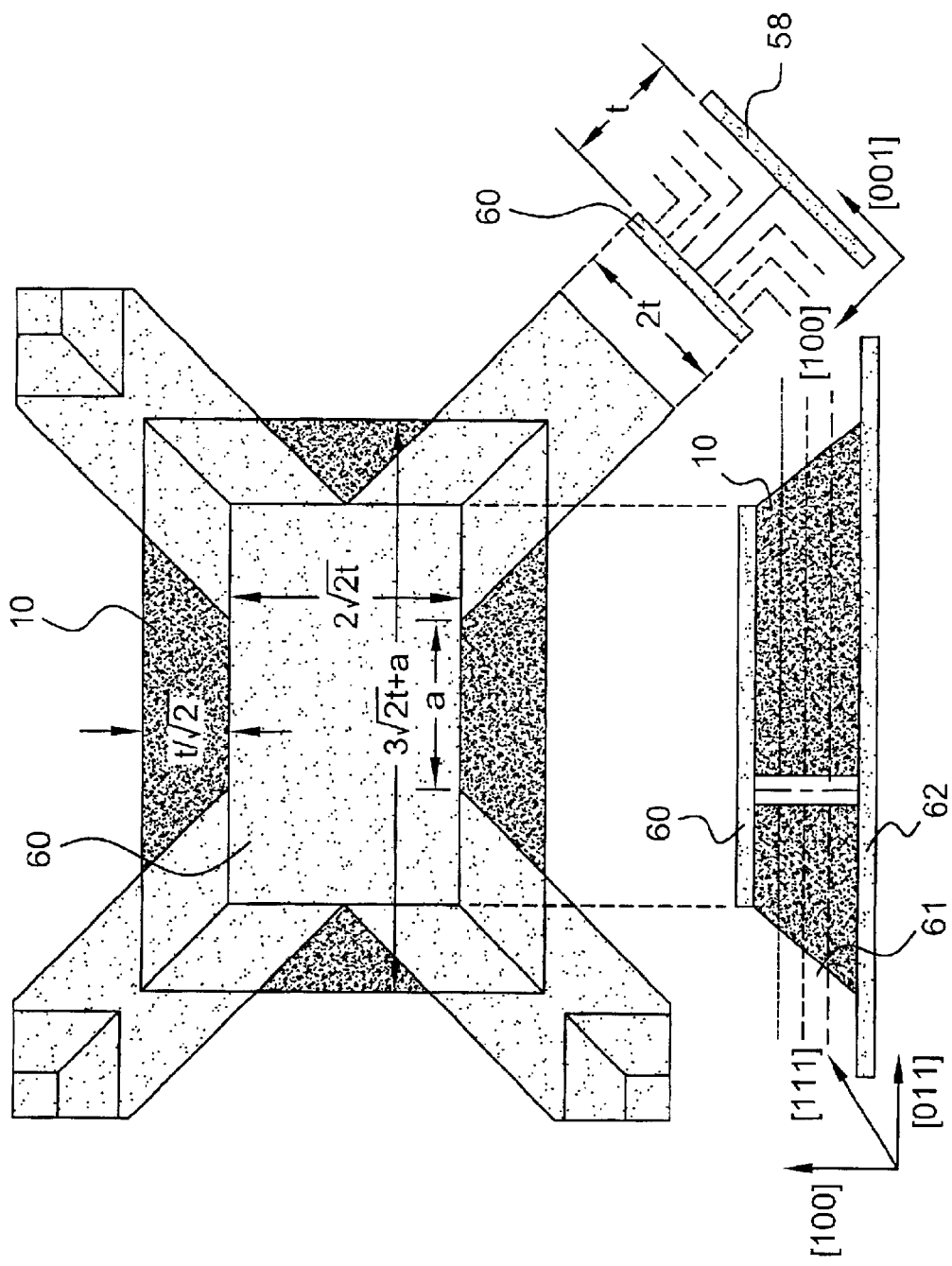
FIG. 9 shows a top plan view and side views of the masking process for forming the trapezoidally-shaped blocks in accordance with one embodiment of the present invention.

The slowest etching planes for silicon in a $KOH:H_2O$ etching solution are the {111} planes, which can be considered etch stops forming the sloping sides of the shaped blocks 10. The respective mask used to define the blocks is aligned to the appropriate crystal axis. As shown in FIG. 9, a mask 60 forms the silicon trapezoidally-shaped blocks 10. Silicon trapezoidally-shaped block 10 is formed at the intersection of the diagonal lines on mask 60, and the larger face 61 of silicon trapezoidally-shaped block 10 is in contact with sacrificial layer 62. The width of the diagonal mask lines may be twice the thickness (t) of silicon block layer. In one embodiment, a=0.2 mm and silicon layer 52 has t=235 $\mu$m.

Etching is completed when silicon layer 52 is etched entirely through, and simultaneously when the corners are precisely formed. Continuing etching beyond this point does not change the overall dimensions of the trapezoidally-shaped block 10, but merely rounds the corners. Because of geometric considerations, the width of the top face of the shaped block 10 may be at least $3\sqrt{2}$ times the thickness of the silicon layer 52. This limits the aspect ratio of the blocks fabricated by the this technique. This mask pattern utilizes as much as 50% of the silicon area if there is no distance between block corners.

The etched silicon wafer is placed in concentrated hydrofluoric (HF) etch solution to remove the shaped blocks from contact with the $SiN_x$ sacrificial layer 58 and any remaining $SiN_x$ from the mask layer. This HF etch solution preferentially etches the sacrificial layer 58 to free the shaped blocks without etching the shaped blocks. In particular, an HF solution having a concentration of about 1:1 $HF:H_2O$ may be used to etch the sacrificial layer 58 to free the shaped blocks 10 without etching the silicon shaped blocks 10.

The slurry comprises an inert solution of fluid and shaped blocks. Enough solution exists in the slurry to allow the blocks to slide across the top surface of a substrate. Preferably, the amount of solution in the mixture is at least the same order as the amount of blocks. Of course, the amount of solution necessary depends upon characteristics such as block size, block material, substrate size, substrate materials, and solution.

The glass tiled display substrate 16 may have etched recessed regions 18 as shown in FIG. 1. A variety of techniques including wet etching, plasma etching, reactive ion etching, ion milling, among others provide recessed regions 18, or generally trenches, receptors, or binding sites. Such techniques etch recessed regions 18 with a geometric profile which is complementary to the block 10. In the glass substrate 16, for example, each recessed region 18 includes a trapezoidal profile or inverted truncated pyramid shape. The trapezoidal profile allows block 10 to self-align and fit closely into recessed region 18 via a transferring technique.

The transferring technique includes evenly spreading or pouring the slurry over the substrate 16. The slurry may be transferred from any type of vessel and/or apparatus capable of evenly transferring the slurry over substrate 16. Generally, the slurry is poured over top of the substrate 16 at a rate which allows substantial coverage, but prevents blocks 10 already disposed into the recessed regions 18 from floating or popping out. Slurry flow is typically laminar but can be non-laminar, depending upon the particular application. The blocks 10 flow evenly with the fluid, tumble onto the substrate 16, self-align, and settle into recessed regions 18.

Optionally, to prevent the blocks already disposed in the recessed regions from floating out, the transferring step may take place in a centrifuge or the like. A centrifuge, for example, places a force on the blocks 10 already disposed in the recessed regions and thereby prevents such blocks from floating out with solution.

Figure 10:
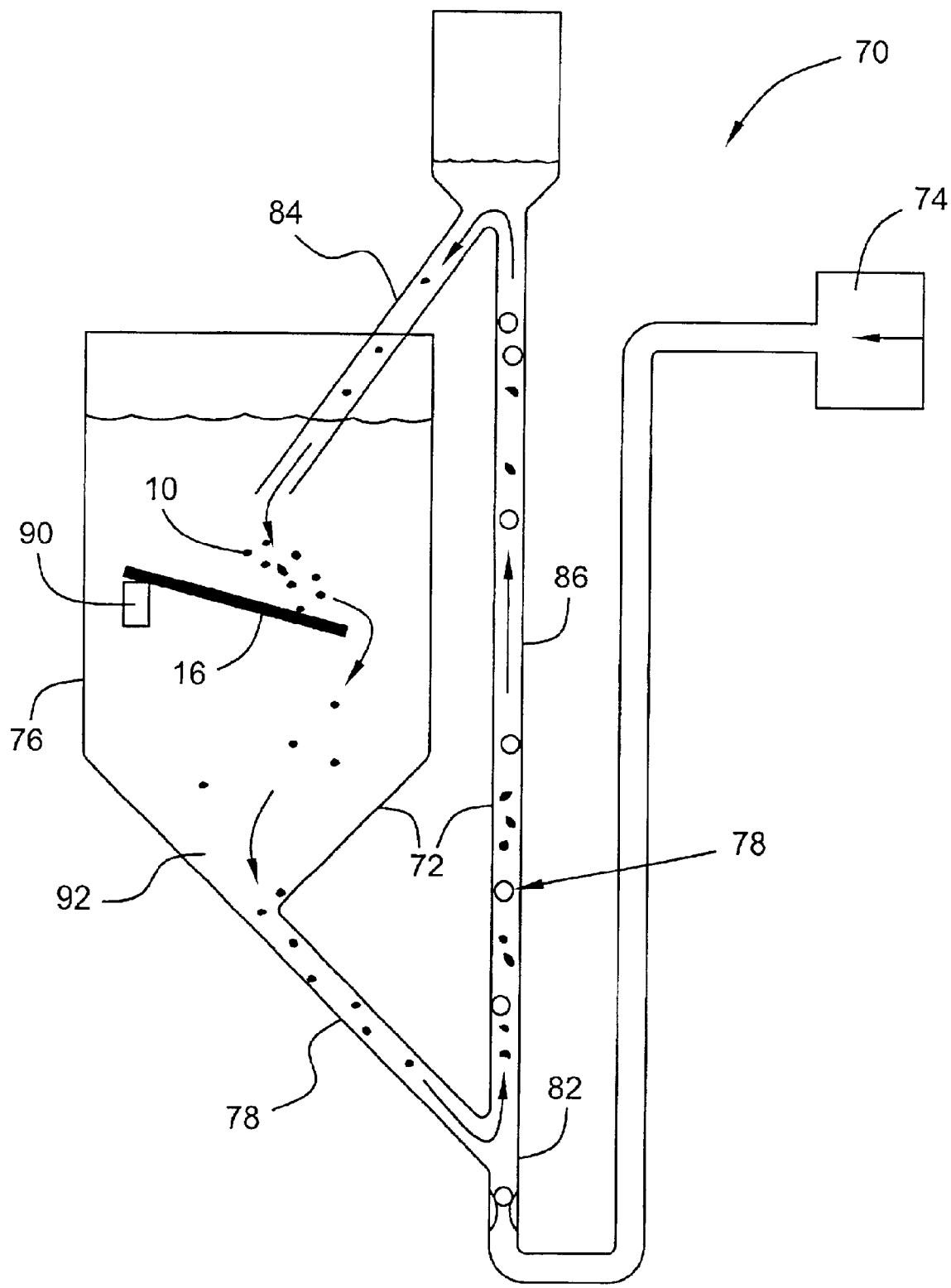
FIG. 10 is a schematic depiction of an apparatus for causing the trapezoidally-shaped blocks to enter recesses formed in a substrate in accordance with one embodiment of the present invention.

As illustrated in FIG. 10, an apparatus 70 includes a vessel 72 and a pump 74. Vessel 72 includes a receptacle 76 and a conduit 78. Vessel 72 contains a substrate 16 having recessed regions 18 receiving the mixture of fluid and shaped blocks 10. Conduit 78, coupled to receptacle 70 which contains substrate 16, includes an input 82, an output 84 leading back to receptacle 76, and a column 86 coupled to one end of input 82 and at the other end to output 76. Pump 74 is coupled to input 82 and dispenses a gas into conduit 78 to facilitate circulation of the fluid and shaped blocks over substrate 16 at a rate where at least one shaped block 10 is disposed into a recessed region 18.

Receptacle 76 includes a holder 90 and a funneled bottom 92. Holder 90 secures substrate 16 and is capable of moving substrate 16 to facilitate the filling of the recessed regions 18. Additionally, holder 90 agitates or orients substrate 16 so that shaped blocks 10 not disposed in recessed regions 18 can flow off substrate 16 and back into a recirculation path in vessel 92. The bottom of receptacle 76 is funnel-shaped to cause the shaped blocks 10 not disposed into recessed regions on substrate 16 to fall to the bottom of receptacle 76 for recirculation through vessel 72. Shaped blocks not disposed into recessed regions then recirculate through vessel 72.

More specifically, funnel bottom 72 is coupled to input 82 of conduit 72. Shaped blocks 10 not disposed into recessed regions 18 tumble to funneled bottom 92 to input 82 of conduit 70, where pump 74 dispenses as gas, such as nitrogen. The injected gas forms bubbles within the fluid inside column 86. A gas bubble transports a portion of the fluid and at least one shaped block funneled to input 82 through column 86 back to receptacle through output 84 for attempted disposition into a recessed region. The gas bubble rises through column 86 and transports the fluid and the shaped block to output 84 leading back to receptacle 76.

In this embodiment, apparatus 70 uses nitrogen bubbles to circulate the fluid and the shaped blocks over substrate 16 without damaging the shaped blocks. Depending on, among other factors, the material of the shaped blocks and the fluid used, apparatus 70 may use other media, or gases such as air, hydrogen ($H_2$), nitrogen ($N_2$), oxygen ($O_2$), or argon (Ar) which do not damage the blocks or otherwise react with the fluid. Pump 74 dispenses the gas or transport medium which can be changed to achieve different fill-factors of the recessed regions.

In a modification to the preceding specific embodiment, the blocks 10 are attached into recessed regions 18 through eutectic layer. Prior to the lift-off step, a metallized layer such as gold, silver, solder, or the like is formed over the regions 18. Alternatively, the layer attaching the block 10 with each recessed region 18 may be a synthetic adhesive or the like instead of a eutectic layer. Process steps comprising masking, etching, and sputtering typically form such metallized layer. Subsequent to the transferring step, a heating structure forms a eutectic layer between metallization layer and silicon substrate 16.

Bubbles may stick to the shaped blocks 10 and to the recessed regions 18 due to the fact that all the silicon surfaces are hydrophobic. Adding a small amount of surfactant makes the silicon surfaces less hydrophobic. The substrate 16 may be oriented at an angle which causes the incorrectly oriented blocks to slide off. Agitation and correct orientation of the substrate 16 may increase the rate at which the blocks fill the regions 18.

In some embodiments, the blocks 10 may include active display drivers which continuously drive the individual pixels. Continuously driving the pixels from the front plane may reduce the demands on emissive materials compared to passive matrix drive systems wherein the pixels are driven in a multiplexing system from the back plane.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A display comprising:
   a plurality of substrates, each substrate having a recess;
   a plurality of display elements formed on each substrate;
   an integrated circuit block mounted in the recess on each substrate at an intersection between four display elements and said block coupled to each of said four display elements; and
   an integrator to couple said substrates to form a tiled display.

2. The display of claim 1 wherein said display element is a light emitting diode.

3. The display of claim 2 wherein said element is an organic light emitting diode.

4. The display of claim 1 wherein said integrated circuit block is a complementary metal oxide semiconductor integrated circuit.

5. The display of claim 1 wherein each block and said substrate are complementarily shaped.

6. The display of claim 1 wherein said block is a driver circuit for said display element.

7. The display of claim 7 wherein said block is located between a plurality of display elements.

8. The display of claim 1 wherein said block is metallized with said substrate.

9. The display of claim 1 including a ceramic back plane and a front plane including said block.

10. The display of claim 1 wherein said block is formed of a silicon substrate and said substrate is formed of glass.

11. The display of claim 1 wherein said block is a nanoblock.

12. The display of claim 11 wherein said nanoblock includes an upper surface exposed when said block is mounted in said recess, said upper surface being substantially coplanar with said substrate.

13. The display of claim 1 wherein said recess is formed at the juncture of said four display elements such that a part of said recess is formed in each of said four display elements and said block is positioned at the intersection of said four display elements.

14. A display comprising:
    a back plane;
    an optical integrator; and
    a front plane between said back plane and said optical integrator, said front plane including four adjacent, intersecting emissive display elements formed on said front plane and an integrated circuit block secured in said front plane between said display elements, said block including a driver circuit coupled to each of said display elements and to said back plane.

15. The display of claim 14 wherein said display elements are light emitting diodes.

16. The display of claim 15 wherein said elements are organic light emitting diodes.

17. The display of claim 14 wherein said block is formed of a metal oxide semiconductor integrated circuit and said front plane is formed of glass.

18. The display of claim 14 wherein said block is deposited in a recess formed in said front plane.

19. The display of claim 12 wherein said driver circuit drives a plurality of adjacent display elements.

20. The display of claim 14 wherein said integrated circuit block is secured over the intersection of said four display elements.

21. A method comprising:
   forming a plurality of light emitting display elements on a module;
   forming recesses in said module to receive integrated circuit nanoblocks with each recess formed between four adjacent intersecting display elements;
   depositing said nanoblocks in said recesses;
   electrically coupling each nanoblock to said four display elements; and
   connecting a plurality of modules to form a tiled display.

22. The method of claim 21 including etching a recess in said module to receive said integrated circuit nanoblock.

23. The method of claim 21 including forming a plurality of nanoblocks by forming a sacrificial layer on a silicon substrate, etching said substrate and then finally etching said sacrificial layer.

24. The method of claim 21 including coupling said nanoblocks to circuits behind said light emitting display.

25. The method of claim 21 including coupling said nanoblocks to said circuits through bond pads on said nanoblocks.

26. The method of claim 21 including forming a recess at the intersection between four adjacent display elements and depositing a nanoblock in said recess so that said block overlaps all four of said display elements.

* * * * *

UNITED STATES PATENT AND TRADEMARK OFFICE
CERTIFICATE OF CORRECTION

PATENT NO. : 6,940,501 B2
DATED : September 6, 2005
INVENTOR(S) : Daniel Seligson It is certified that error appears in the above-identified patent and that said Letters Patent is hereby corrected as shown below:

Column 6,
Line 28, "7" should be -- 6 --.
Line 66, "12" should be -- 14 --.

Signed and Sealed this

Twenty-seventh Day of December, 2005

JON W. DUDAS
*Director of the United States Patent and Trademark Office*